(12) United States Patent
Wang et al.

(10) Patent No.: US 11,837,464 B2
(45) Date of Patent: Dec. 5, 2023

(54) METHODS, SYSTEMS, AND APPARATUS FOR TAPE-FRAME SUBSTRATE CLEANING AND DRYING

(71) Applicant: Applied Materials, Inc., Santa Clara, CA (US)

(72) Inventors: Ying Wang, Singapore (SG); Guan Huei See, Singapore (SG); Gregory J. Wilson, Kalispell, MT (US)

(73) Assignee: APPLIED MATERIALS, INC., Santa Clara, CA (US)

(*) Notice: Subject to any disclaimer, the term of this patent is extended or adjusted under 35 U.S.C. 154(b) by 15 days.

(21) Appl. No.: 17/569,629

(22) Filed: Jan. 6, 2022

(65) Prior Publication Data
US 2023/0215722 A1 Jul. 6, 2023

(51) Int. Cl.
*H01L 21/02* (2006.01)
*H01L 21/67* (2006.01)
*H01L 21/683* (2006.01)
*B08B 3/02* (2006.01)

(52) U.S. Cl.
CPC ......... *H01L 21/02076* (2013.01); *B08B 3/02* (2013.01); *H01L 21/67051* (2013.01); *H01L 21/6836* (2013.01)

(58) Field of Classification Search
CPC ......... H01L 21/02076; H01L 21/67051; H01L 21/6836
See application file for complete search history.

(56) References Cited

U.S. PATENT DOCUMENTS

| 9,472,458 | B2 | 10/2016 | Doub et al. |
| 2004/0115567 | A1* | 6/2004 | Mandal ............... G03F 7/3021 430/327 |
| 2015/0187625 | A1 | 7/2015 | Busche et al. |
| 2015/0221505 | A1 | 8/2015 | Park et al. |
| 2019/0288203 | A1* | 9/2019 | Jung ................. H10N 70/882 |
| 2020/0083087 | A1 | 3/2020 | Ni et al. |
| 2020/0090934 | A1 | 3/2020 | Kitahara |

FOREIGN PATENT DOCUMENTS

JP 2012-146935 A 8/2012

OTHER PUBLICATIONS

International Search Report for PCT/US2022/052274, dated Apr. 28, 2023.

* cited by examiner

*Primary Examiner* — Natasha N Campbell
(74) *Attorney, Agent, or Firm* — MOSER TABOADA

(57) ABSTRACT

Methods, systems, and apparatus for cleaning and drying a tape-frame substrate are provided. In embodiments, an apparatus for supporting a tape-frame substrate includes a chuck having a first side and a second side opposite the first side, the first side having a convex surface configured to support the tape-frame substrate; and a plurality of channels extending through the chuck and having outlets along the first side, wherein the plurality of channels are configured to dispense fluid from the outlets along the convex surface of the first side. In embodiments, a support system includes the chuck and a holder configured to mount a tape-frame substrate to the chuck. The plurality of channels are configured to dispense fluid from the outlets and between the tape-frame substrate and the convex surface of the chuck when the tape-frame substrate is mounted to the chuck.

11 Claims, 4 Drawing Sheets

METHODS, SYSTEMS, AND APPARATUS FOR TAPE-FRAME SUBSTRATE CLEANING AND DRYING

FIELD

Embodiments of the present disclosure generally relate to methods, systems, and apparatus for processing substrates. More particularly, embodiments of the disclosure relate to methods, systems, and apparatus for wet cleaning and drying of tape-frame substrates.

BACKGROUND

Substrates undergo various processes during the fabrication of semiconductor integrated circuit devices. Some of these processes include wafer (e.g., substrate) dicing, in which a processed wafer is placed on a dicing tape and is cut or separated into a plurality of dies or chiplets. After dicing, cleaning of the front and backside of a tape-frame wafer is performed such as with a pressurized nozzle dispensing a fluid. Such cleaning is challenging due to the mechanical fragility of thin dies and the small separation between them on the dicing tape. For example, the suspended dicing tape can vibrate and/or deflect under a pressurized nozzle, creating particles and causing thin die breakage and damage.

Accordingly, the inventors have provided improved methods, systems, and apparatus for cleaning and drying tape-frame substrates.

SUMMARY

Methods, systems, and apparatus for processing tape-frame substrates are provided herein. In some embodiments, an apparatus for supporting a tape-frame substrate includes a chuck having a first side and a second side opposite the first side, the first side having a convex surface configured to support the tape-frame substrate. Also, the apparatus includes a plurality of channels extending through the chuck and having outlets along the first side. The plurality of channels are configured to dispense fluid from the outlets along the convex surface of the first side.

In some embodiments, a system for supporting a tape-frame substrate includes a chuck having a first side and a second side opposite the first side, the first side having a convex surface configured to support the tape-frame substrate, and a plurality of channels extending through the chuck and having outlets along the first side. The plurality of channels are configured to dispense fluid from the outlets along the convex surface of the first side. Also, the system includes a holder configured to mount a tape-frame substrate to the chuck. The plurality of channels are configured to dispense fluid from the outlets and discharge fluid between the tape-frame substrate and the convex surface of the chuck when the tape-frame substrate is mounted to the chuck.

A method of cleaning a tape-frame substrate includes mounting a tape-frame substrate to a chuck. The chuck has a first side and a second side opposite the first side. The first side has a convex surface configured to support the tape-frame substrate. The chuck has a plurality of channels extending through the chuck and have outlets along the first side. The tape-frame substrate has a dicing tape having a first side and a second side and a plurality of substrates attached to the first side of the dicing tape. Also, the method includes directing a first fluid through the chuck and dispensing the first fluid out of the outlets into a space between the convex surface and the second side of the dicing tape, and directing a second fluid onto the substrates from a fluid source positioned facing the first side of the dicing tape.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
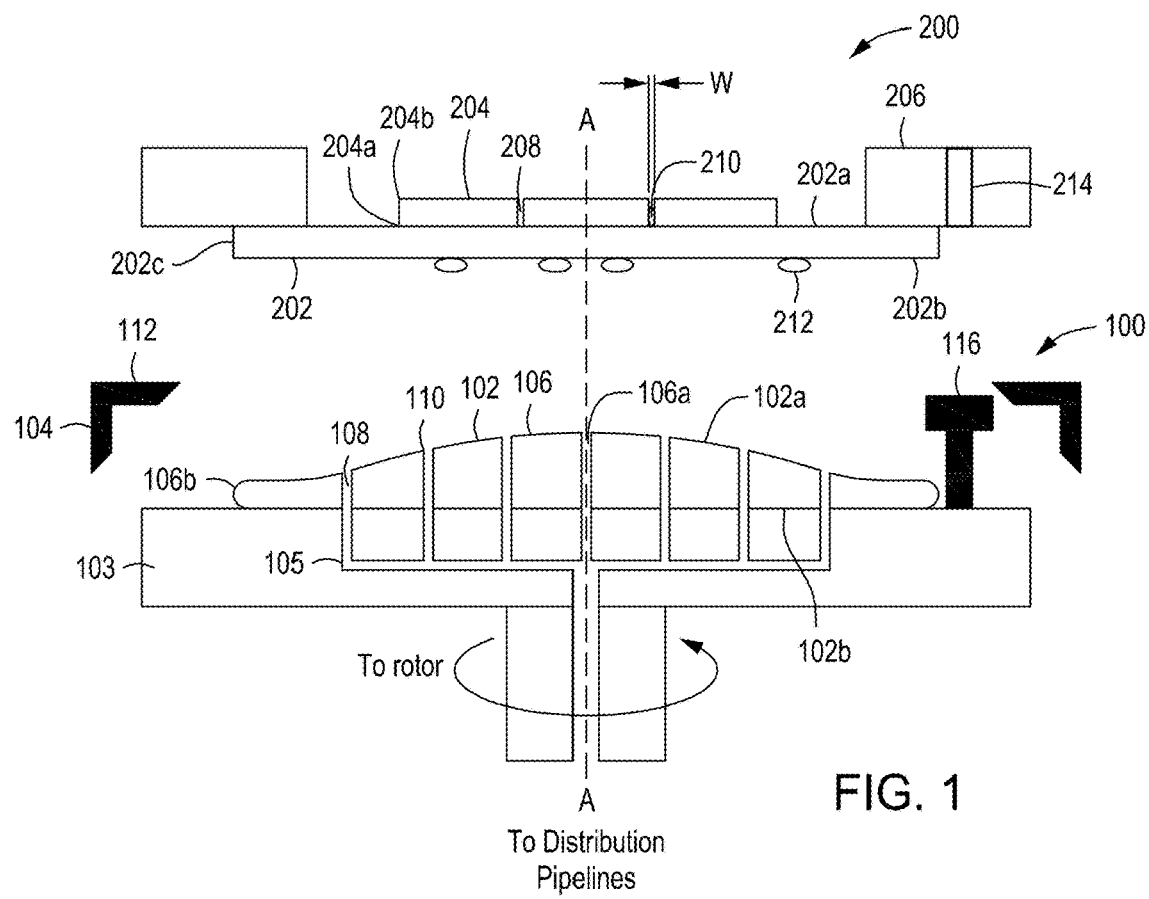
FIG. 1 is a schematic, sectional side view of a support system and a tape-frame substrate in a first configuration, according to embodiments of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a method, apparatus, and system for wet cleaning and drying of tape-frame substrates are provided herein. The embodiments of the methods, systems, and apparatus described herein can improve dicing lane cleaning between substrates on a tape-frame substrate, reduce particle generation, and mitigate thin die breakage during wet cleaning and drying of tape-frame substrates. Also, the embodiments of the methods, systems, and apparatus described herein may eliminate a need to flip or otherwise turn the tape-frame substrate over for cleaning and drying both sides of the tape-frame substrate.

FIG. 1 is a schematic sectional side view of a support system 100 according to embodiments of the present disclosure. The support system 100 is configured to support a tape-frame substrate 200, such as during wet cleaning and drying methods in accordance with the present disclosure.

The tape-frame substrate 200 may include a dicing tape 202, a plurality of substrates 204 attached to the dicing tape 202, and a frame 206 connected to the dicing tape 202. In embodiments, the dicing tape 202 has elastic properties that allow the dicing tape to elastically deform during wet cleaning and drying processes, as discussed in greater detail below. In embodiments, the dicing tape 202 may be commercially available dicing tape, such as Series Q or G dicing tape commercially available from Lintec Corporation, of Tokyo, Japan.

The dicing tape 202 has a front or first side 202a and a back or second side 202b. The plurality of substrates 204 are attached to the front or first side 202a of the dicing tape 202, such as with an adhesive. The substrates 204 are spaced by dicing lanes 208. In some embodiments, the frame 206 surrounds the plurality of substrates 204. The frame 206 may extend along or near an outer edge 202c of the dicing tape 202. In some embodiments, the frame 206 is relatively rigid in comparison to the dicing tape 202, which is relatively flexible. In some embodiments the frame 206 may be formed of a metal, such as stainless steel.

As a result of dicing or other processing operations, particles 210, 212 may be attached to the tape-frame substrate 200. Some particles 210 are shown in the dicing lanes 208 between adjacent substrates 204 and some particles 212 are attached to the back or second side 202b of the dicing tape 202, As discussed in greater detail below, embodiments of wet cleaning and drying methods in accordance with the present disclosure may be employed to remove the particles 210, 212.

In FIG. 1 the support system 100 is shown in a first configuration where the tape-frame substrate 200 is not mounted to the support system 100. In the first configuration the dicing tape 202 is shown in a flat, undeformed configuration with the substrates 204 spaced apart by a width W of the dicing lanes 208. A central axis A extends through the center of the support system 100 and the tape-frame substrate 200. Each substrate 204 extends parallel to the axis A from a base 204a at the first side 202a of the dicing tape 202 to a free end 204b spaced axially from the base 204a. As used herein, "axial" or "axially" refers to a direction along or parallel to axis A. In the flat configuration of the dicing tape 202 shown in FIG. 1, the width W of each dicing lane 208 is relatively constant along the axial direction.

The support system 100 includes a chuck 102 and a holder 104. In some embodiments, the chuck 102 is an upper portion of a pedestal 103, which may be configured to rotate about axis A with the chuck 102, The chuck 102 has a first or front side 102a and a second or back side 102b opposite the first side 102a. The central axis A extends through the center of the chuck 102 between the first side 102a and the second side 102b. In embodiments, as shown in FIG. 1, the tape-frame substrate 200 is configured to coaxially align with the chuck 102.

Figure 3:
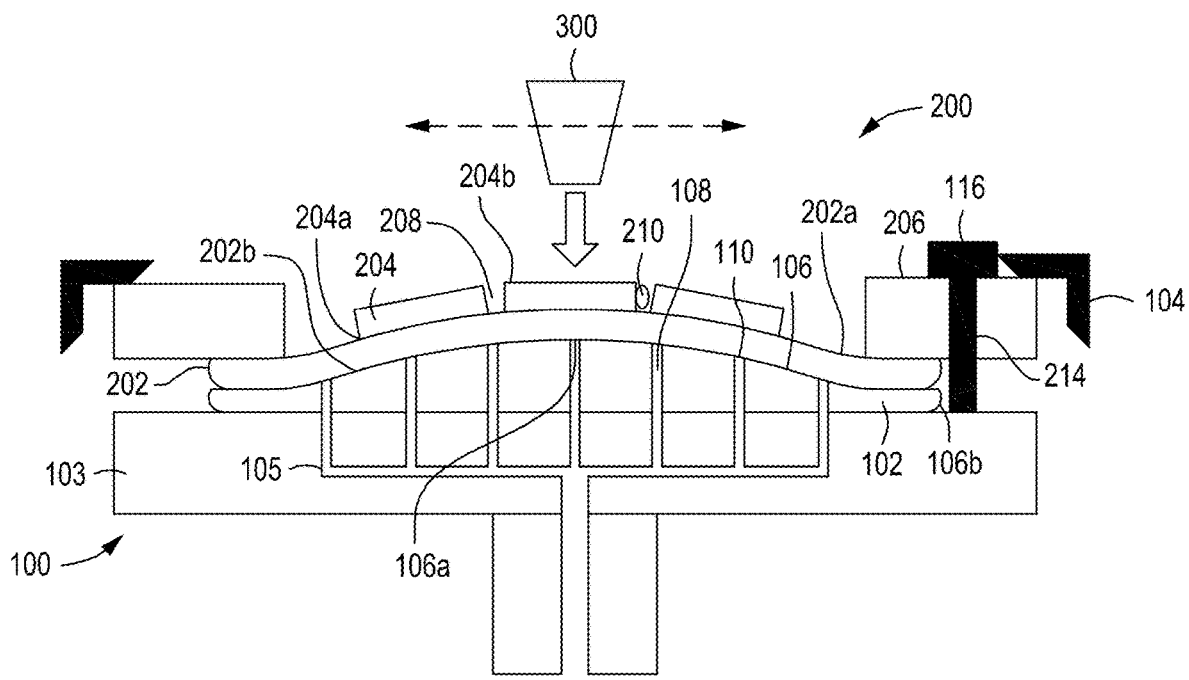
FIG. 3 is a is a schematic sectional side view of the support system and the tape-frame substrate of FIG. 1 in a third configuration during a cleaning and drying process of a first or front side of the tape-frame substrate, according to embodiments of the disclosure.

The first side 102a of the chuck 102 has a convex surface 106 configured to support the tape-frame substrate 200 in a third configuration, such as shown, for example, in FIG. 3. Specifically, the convex surface 106 is configured to elastically deform the dicing tape 202 of the tape-frame substrate 200, as discussed in greater detail below. The convex surface 106 has a peak at a center 106a and an outer edge 106b. In embodiments, the convex surface 106 is axisymmetric about axis A.

Also, the chuck 102 has a plurality of channels 108 extending through the chuck 102 and having outlets 110 along the first side 102a. In embodiments, the channels 108 extend from the first side 102a to the second side 102b. The channels 108 may fluidly couple to fluid channels 105 in the pedestal 103. The plurality of channels 108 are configured to dispense fluid from the outlets 110 along the convex surface 106 of the first side 102a of the chuck 102. In some embodiments, the fluid is dispensed as a laminar flow outflow along the convex surface 106 from the center 106a to the outer edge 106b of the convex surface 106.

The cross-sectional area of the channels 108 and/or outlets 110 may be sized based on the cross-sectional area of the substrates 204 of the dicing tape 202. For example, in some embodiments the outlets 110 may have a cross-sectional area that is less than a cross-sectional area of a respective substrate 204 aligned with the outlet 110 along a direction parallel with the central axis A, which may ensure the substrates 204 are adequately supported by the convex surface 106 to reduce bending stress or breakage of the substrates during cleaning and drying.

Figure 2:
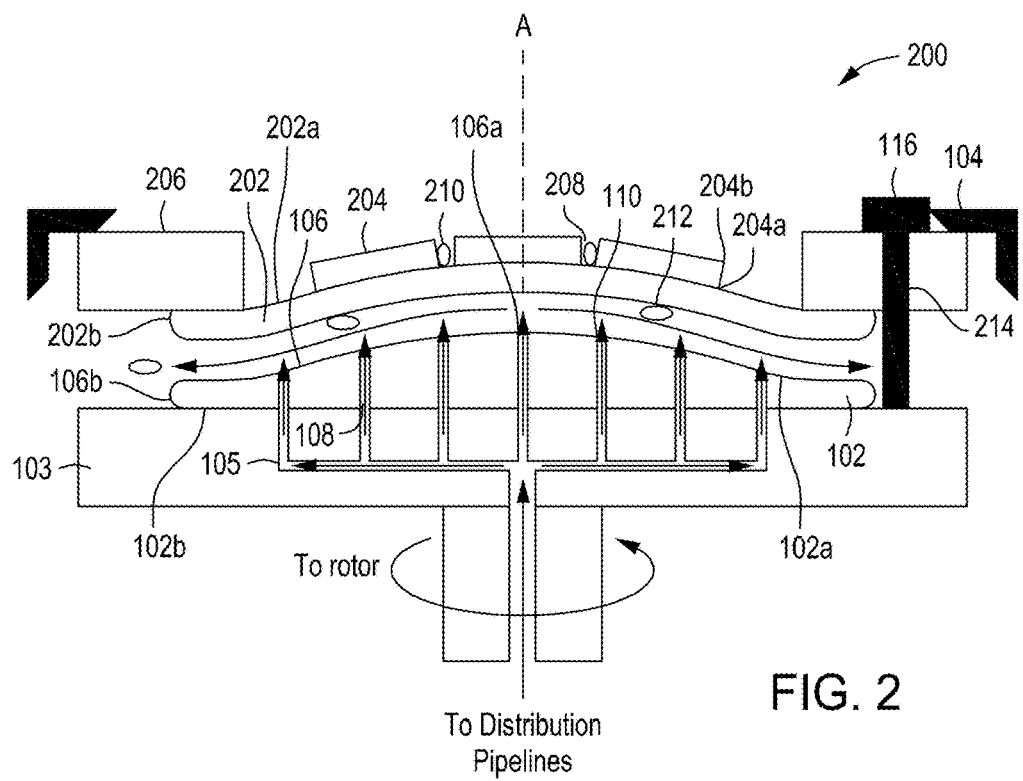
FIG. 2 is a schematic, sectional side view of the support system and the tape-frame substrate of FIG. 1 in a second configuration used during a cleaning and drying process of a second or back side of the tape-frame substrate, according to embodiments of the disclosure.

The holder 104 is configured to removably mount the tape-frame substrate 200 to the chuck 102. The holder 104 includes fingers 112 that are configured to engage the frame 206 of the tape-frame substrate 200, as shown in FIGS. 2 and 3, to retain the tape-frame substrate 200 relative to the chuck 102 in either of the second or third configurations. In some embodiments, such as that shown in FIG. 2, the holder 104 may be configured as a "soft lock" that is biased to permit an amount of limited relative movement in the axial direction between the frame 206 and the chuck 102 as discussed in greater detail below.

In some embodiments, the frame 206 is circular and the holders 104 are arranged in spaced relation to one another around the circular frame 206. Also, in some embodiments, the chuck 102 and the holder 104 are configured to rotate together about the central axis A with or without the tape-frame substrate 200 being mounted to the chuck 102. Such rotation may be utilized during washing or drying of the tape-frame substrate 200.

In some embodiments, the support system 100 may also include locking screws 116 configured to secure the tape-frame substrate 200 at cuts 214 (two cuts formed in commercially available frames 206) formed in the frame 206 of the tape frame substrate 200. In some embodiments the locking screws 116 extend from the pedestal 103 to the frame 206. The locking screws 116 are configured to prevent relative rotation between the support system 100 and the tape-frame substrate 200 during rotation of the tape-frame substrate 200 and the support system 100 about the central axis A.

FIG. 2 is a schematic sectional side view of the tape-frame substrate 200 mounted to the support system 100 in a second configuration for a cleaning and/or drying process of the back or second side 202b of the dicing tape 202, according to embodiments of the present disclosure. In the embodiment shown in FIG. 2, the tape-frame substrate 200 is mounted to the chuck 102 in alignment with the central axis A. The fingers 112 of the holder 104 engage the frame 206 of the tape-frame substrate 200 so that the tape-frame substrate is retained relative to the chuck 102.

As noted above, in some embodiments, the holder 104 may be configured to permit a slight axial displacement of the holder 104 and, consequently, of the tape-frame substrate during cleaning. For example, during a cleaning process of the second side 202b of the dicing tape 202 shown in FIG. 2, the holder 104 may retain the frame 206 of the tape-frame substrate 200 so that the dicing tape 202 initially contacts and elastically deforms around the convex surface 106, so that the dicing tape 202 and the system assume the third configuration shown in FIG. 3. Nevertheless, during a wet cleaning or drying method of the second side 202b of the dicing tape 202, a liquid (e.g., deionized water or pressurized gas) is directed through the channels 108 to the outlets 110 between the second side of the dicing tape 202 and the convex surface 106. The dispensed fluid may exert fluid pressure on the dicing tape 202 to overcome the bias of the soft lock feature of the holder 104 and the weight of the tape-frame substrate 200 to cause the entire tape-frame substrate 200 to lift slightly off the convex surface 106 due to the soft lock feature of the holder 104, thus assuming the second configuration of the tape-frame substrate 200 and system 100 shown in FIG. 2. The dispensed fluid may have a pressure of 50 psi to 1000 psi.

In addition to lifting the tape-frame substrate 200, the fluid pressure causes elastic deformation of the dicing tape 202. As shown in FIG. 2, the fluid pressure causes the dicing tape 202 to elastically deform with a curvature corresponding to the curvature of the convex surface 106. Thus, in the second configuration, the fluid acts as a layer that can support the tape-frame substrate 200 and elastically deform the dicing tape 202.

In the second configuration shown in FIG. 2, the fluid flows outward from the center 106a to the outer edge 106b of the convex surface 106 between the second side 202b of the dicing tape 202 and the convex surface 106. The channels 108 and the outlets 110 are configured to produce flow of the fluid under a laminar flow regime along the convex surface 106 to facilitate flushing of the particles 212 attached to the second side 202b of the dicing tape 202.

The elastic deformation of the dicing tape 202 caused by the fluid pressure causes the substrates 204 to splay, thereby increasing the width of the dicing lanes 208 in the axial direction. That is, the width of the dicing lanes 208 between the free ends 204b of adjacent substrates 204 is larger than the width between the bases 204a of adjacent substrates 204. In some embodiments, fluid is dispensed from the outlets 110 to elastically deform the dicing tape 202 to maintain uniform dicing lanes 208 over the dicing tape 202. As discussed in greater detail below, various parameters, such as channel density, outlet size, shapes, and angle, and outflow pressure may be selected or adjusted to achieve uniform elastic deformation of the dicing tape 202 to maintain uniform dicing lanes 208 of the dicing tape 202.

Moreover, the elastic deformation of the dicing tape 202 can reduce vibration of the tape-frame substrate 200 when the dicing tape 202 is impinged by the fluid during cleaning or drying. The increased spacing between the free ends 204b of the substrates 204 and the reduced vibration of the tape-frame substrate can reduce edge rubbing and breakage of the substrates 204 during cleaning and drying of the second side 202b of the dicing tape 202.

As noted above, the arrangement shown in FIG. 2 may be used for wet cleaning and drying the second side 202b of the dicing tape 202. During wet cleaning the fluid may be deionized water, while during drying, the fluid may be a pressurized gas, such as nitrogen. Also, in embodiments, during wet cleaning or drying, the mounted tape-frame substrate 200 may be rotated in unison with the support system 100 about the central axis A while the pressurized gas flows through the channels 108 and is dispensed out the outlets 110 in the space between the convex surface 106 and the second side 202b of the dicing tape 202.

FIG. 3 is a is a schematic sectional side view of the support system and the tape-frame substrate of FIG. 1 in a third configuration during a cleaning and drying process of a first or front side of the tape-frame substrate, according to embodiments of the present disclosure. FIG. 3 shows the tape-frame substrate 200 mounted to the chuck 102 in a third configuration for cleaning and drying, in accordance with embodiments of the present disclosure. In the third configuration, the holder 104 retains the frame 206 of the tape-frame substrate 200 so that the dicing tape 202 engages and elastically deforms about the convex surface 106 of the chuck 102. In embodiments, the convex surface 106 makes uniform contact with the dicing tape 202 and conforms to the convex surface 106. As a result of the elastic deformation of the dicing tape 202, the substrates 204 splay so that the width of the dicing lanes 208 increase in the axial direction, in similar fashion to that described above in the second configuration. Thus, the width of the dicing lanes 208 is larger at the outer edges 204b of the substrates 204 than at the bases 204a. The increased width of the dicing lanes 208 exposes the particles 210 in the dicing lanes 208 to facilitate flushing of the particles 210.

In the embodiment shown in FIG. 3, a swinging or otherwise movable fluid source (e.g., a nozzle) 300 may be used to dispense pressurized fluid (e.g., liquid or gas) onto the substrates 204 and the first side 202a of the dicing tape 202 and into the dicing lanes 208. The dispensed pressurized fluid may have a pressure of 50 psi to 1000 psi. The fluid source 300 is positioned facing the first side 202a of the dicing tape 202. During cleaning, high-pressure liquid is dispensed from the fluid source 300 and directed into the expanded dicing lanes 208 to flush out the particles 210. During drying, a pressurized gas may be dispensed from the fluid source 300 to dry the substrates 204 and the first side 202a of the dicing tape 202, including the dicing lanes 208.

Cleaning and drying of the tape-frame substrate 200 in the third configuration can stabilize the dicing tape 202 and the substrates 204 to limit the substrates 204 from rubbing, breaking, and generating particles. Due to straining of the dicing tape 202 against the convex surface 106 of the chuck 102, the tape-frame substrate may experience little vibration or deflection (apart of compression of the dicing tape 202 discussed below) during cleaning or drying of the substrates 204 and the first side 202a of the dicing tape 202, thereby limiting the chance of the substrates 204 rubbing, breaking, and generating particles during cleaning and drying. Moreover, the increased width of the dicing lanes 208 caused by the splaying of the substrates 204 in the third configuration can also reduce rubbing and breaking of substrates during cleaning and drying. The reduction in vibration and increased dicing lane width may, thus, permit the use of high-impact cleaning (mist, jet, etc.) as well as pressurized gas-assisted drying of the dies without an increased risk of the substrates rubbing, breaking, and generating particles.

In addition to being elastic, the dicing tape 202 may be slightly compressible in the axial direction. Thus, it is possible in the third configuration that the dicing tape 202 may compress and deflect slightly towards the chuck 102 when the tape-frame substrate 200 is locally impinged by fluid dispensed from the fluid source 300. Nevertheless, the convex surface 106 may be designed to have a sufficient convex curvature to ensure that the widths of the dicing lanes 208 remain open to prevent edge rubbing of adjacent substrates 204 even if the dicing tape 202 is locally compressed by fluid dispensed by the nozzle 300.

Thus, the embodiments of the methods, systems, and apparatus described herein can improve dicing lane cleaning, reduce particle generation, and mitigate thin die breakage during wet cleaning and drying of tape-frame substrates. Also, the embodiments of the methods, systems, and apparatus described herein may eliminate a need to flip or otherwise turn the tape-frame substrate over for cleaning and drying both sides of the tape-frame substrate.

Figure 4A:
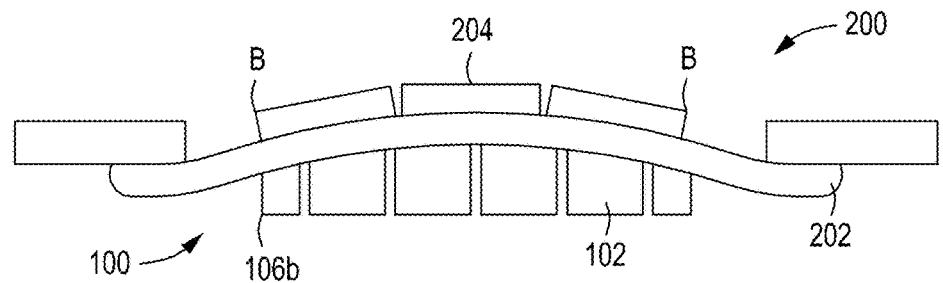
FIG. 4a is a schematic sectional side view of the support system and tape-frame substrate of FIG. 3 in the third configuration with an alternate chuck, according to embodiments of the disclosure.
Figure 4B:
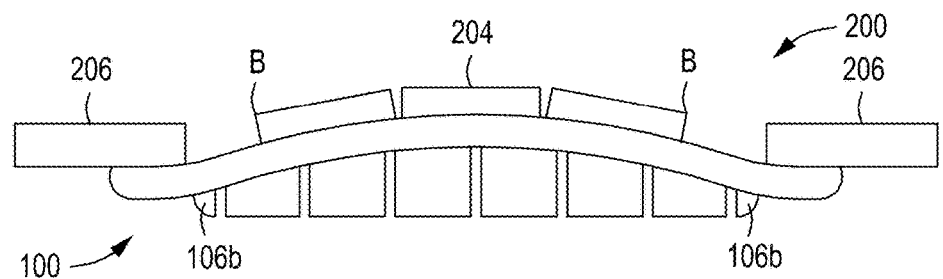
FIG. 4b is a schematic sectional side view of the support system and tape-frame substrate of FIG. 3 in the third configuration with an alternate chuck, according to embodiments of the disclosure.

As noted above, the convex surface 106 of the chuck 102 is configured to provide support for the tape frame substrate 200. The convex surface 106 may have various configurations and dimensions. In embodiments, the convex surface 106 at least projects onto an area occupied by the substrates 204 to support the substrates 204 in the axial direction. For example, in the embodiment shown in FIG. 1, the outer edge 106b of the convex surface 106 extends radially with respect to axis A to the outer edge 202c of the dicing tape 202 so that the entire dicing tape 202 can make contact with and be supported by the convex surface 106 in the third configuration. In some alternate embodiments, such as that shown in FIG. 4a, the outer edge 106b of the convex surface 106 extends to an outer boundary B of an area occupied by the substrates 204. Also, in some embodiments, such as that shown in FIG. 4b, the outer edge 106b of the convex surface 106 extends between the outer boundary B and the frame 206.

In embodiments, the convex surface has a peak at center 106a and extends to the outer edge 106b. In embodiments, a height of the convex surface, measured as an axial distance between the peak and the outer edge, is up to about 16 mm. Such dimensions allow the convex surface 106 to sufficiently elastically deform the dicing tape 202 in the third configuration without causing damage to the dicing tape 202 or the substrates 204. In embodiments, the height of the convex surface 106 may be based on the amount of the area of the tape frame substrate 200 supported by the convex surface 106. For example, in the embodiment shown in FIG. 1, the height of the convex surface 106 may be up to about 16 mm. In the embodiment shown in FIG. 4a, the height of the convex surface 106 may be up to about 10 mm.

In embodiments, at least one of channel density (number of channels per unit area), channel size, channel shape, channel outflow angle, or outflow pressure may be selected to provide a uniform fluid pressure under all substrates 204 to maintain uniform shape of the dicing lanes 208 over the entire tape-frame substrate 200. Also, in embodiments, at least one of channel density, channel size, channel shape, channel outflow angle, or outflow pressure may be selected to permit a high radial fluid flow rate for better cleaning and drying efficiency, with or without the assistance of rotating the tape-frame substrate 200 during cleaning or drying. Moreover, in embodiments, at least one of channel density, channel size, or channel shape may be selected to provide a smooth convex surface with minimum opening hole size so that thin substrates 204 experience less warping/bowing on the outlets 110 during high pressure cleaning and drying of the substrates 204 and first side 202a of the dicing tape 202.

Figure 5:
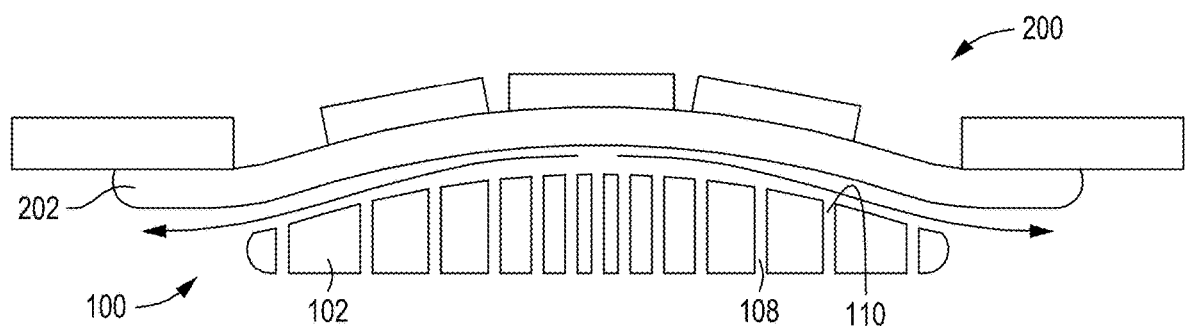
FIG. 5 is a schematic sectional side view of the support system and tape-frame substrate of FIG. 2 in the second configuration with an alternate chuck, according to embodiments of the disclosure.

In the embodiments shown in FIGS. 1 to 3, the density of the channels 108 and their outlets 110 on the convex surface 106 is uniform throughout the convex surface 106. In some embodiments, such as that shown in FIG. 5, the density of the channels 108 and the outlets 110 may vary throughout the convex surface 106. For example, as shown in FIG. 5, the density of channels 108 and the outlets 110 is higher towards the central axis A than at the outer edge 106b of the convex surface 106. In some embodiments, the density of outlets may be 1 to 25 outlets per square centimeter of the convex surface 106.

Figure 6:
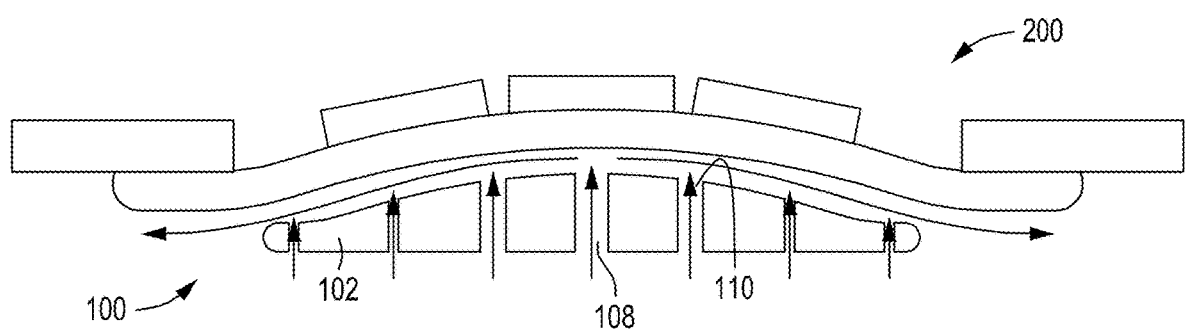
FIG. 6 is a schematic sectional side view of the support system and tape-frame substrate of FIG. 2 in the second configuration with an alternate chuck, according to embodiments of the disclosure.

Also, the outlets 110 may have the same or different sizes (e.g., diameters). In the embodiment of the chuck 102 shown in FIGS. 1-3, the outlets 110 have the same sizes. In the embodiment of the chuck 102 shown in FIG. 6, the outlets 110 have different diameters, with larger diameter outlets 110 being located radially closer to the central axis A and smaller diameter outlets 110 being located radially further from the central axis A. In embodiments, the outlets may have a diameter of about 0.5 mm to 3 mm.

Figure 7:
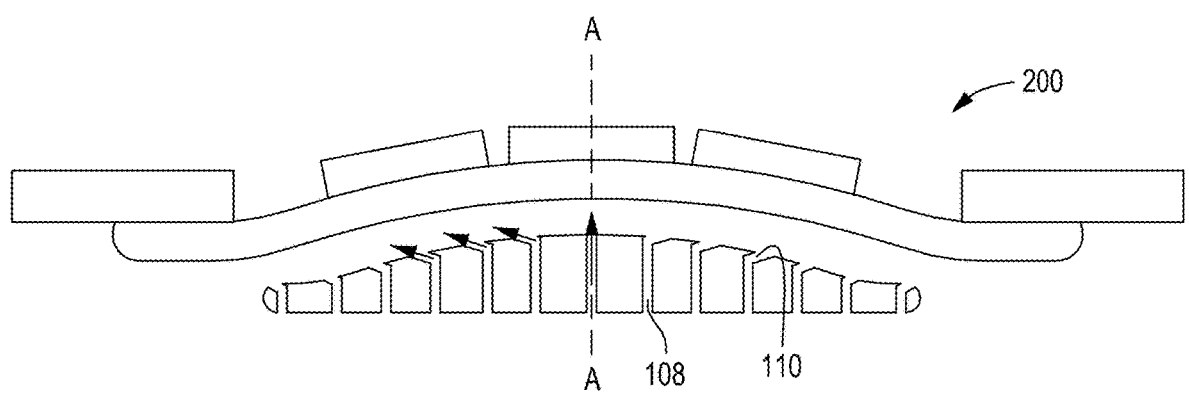
FIG. 7 is a schematic sectional side view of the support system and tape-frame substrate of FIG. 2 in the second configuration with an alternate chuck, according to embodiments of the disclosure.

The outlets 110 may be directed in the same or different directions. For example, in the embodiments shown in FIGS. 1-3, all of the outlets 110 are directed parallel to each other and to the central axis A. However, in the embodiment shown in FIG. 7, the outlets 110 are directed at different angles that are non-parallel with respect to the central axis A.

In the embodiments shown in FIGS. 1-3, the channels 108 and outlets 110 are fully open. In some embodiments, such as shown in FIGS. 8 and 9, one or more of the channels 108 and outlets 110 may have an actuatable flow control element (e.g., a valve) to independently control flow through the channels 108 and outlets 110.

Figure 8:
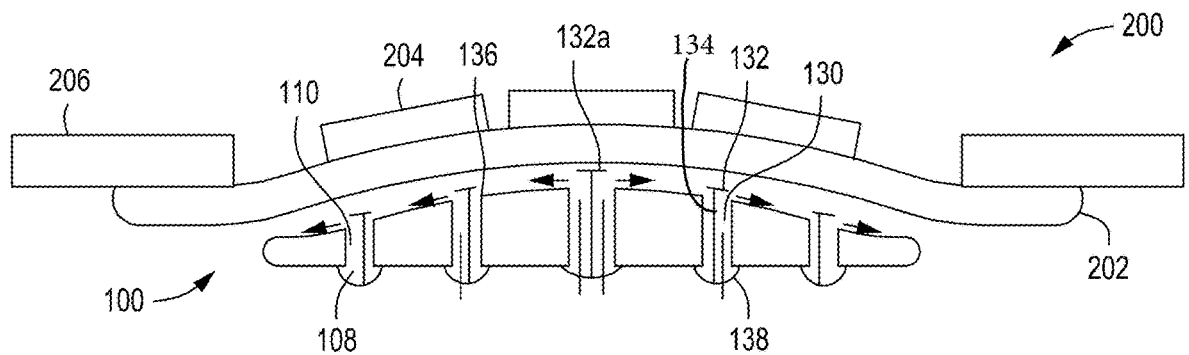
FIG. 8 is a schematic sectional side view of the support system and tape-frame substrate of FIG. 3 in the third configuration with an alternate chuck, according to embodiments of the disclosure.
Figure 9:
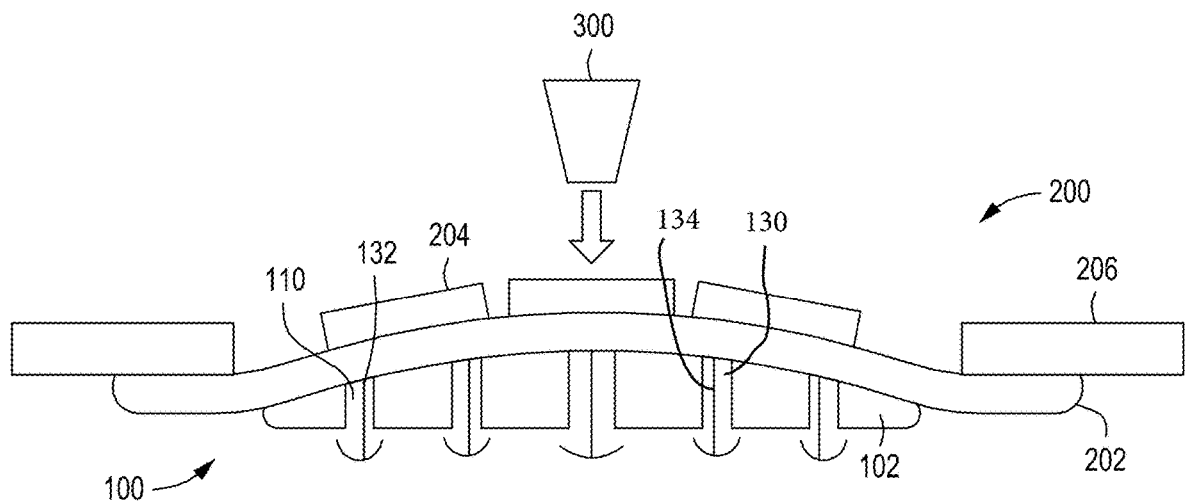
FIG. 9 is a schematic sectional side view of the support system and tape-frame substrate of FIG. 3 in the third configuration with an alternate chuck, according to embodiments of the disclosure.

For example, FIGS. 8 and 9 show an embodiment of a chuck 102 that includes a plurality of valves 130. In FIGS. 8 and 9 each valve 130 corresponds to one channel 108. Each valve 130 has a head 132 and a stem 134 extending from the head 132. The head 132 is configured to seal with a valve seat 136 formed in the convex surface 106 so that a face 132a of the head 132 is substantially flush with the convex surface 106. In comparison to the open outlets 110 of the embodiments shown in FIGS. 1-3, the flush faces 132a of the heads 132 of the valves 130 may provide additional support for the substrates 204 of the tape-frame substrate 200 during cleaning and drying operations when the tape-frame substrate 200 is in the third configuration, as shown in FIG. 9. A smoother convex surface 106 with fewer or smaller open outlets 110 may be beneficial to reduce warping/bowing of thin dies supported on the channel outlets 110 during high pressure cleaning and drying of the tape-frame substrates 200 when mounted in the third configuration.

In embodiments, the stem 134 of each valve 130 extends through the corresponding channel 108 beyond the second side 102b of the chuck 102 and may be connected to a stop 138. The stop 138 is configured to limit the axial displacement of the valve 130 with respect to the chuck 102. In embodiments, a biasing element, such as a spring (not shown), may be connected between the stop 138 and the second side 102b of the chuck 102 to bias the head 132 of the valve 130 into a closed or sealed position with the valve seat 136, as shown in FIG. 9.

As shown in FIG. 8, during a cleaning or drying operation of the second side 202b of the dicing tape 202, the valves 130 may be opened by flowing fluid through the channels 108 to the first side 102a of the chuck 102 at a sufficient pressure to counter the weight of the valve 130 and/or bias on the valves 130. In FIG. 8, when the valves 130 are opened by the flowing fluid, the heads 132 of valves 130 remain spaced from the second side 202b of the dicing tape 202.

While the foregoing is directed to embodiments of the present disclosure, other and further embodiments of the disclosure may be devised without departing from the basic scope thereof.

The invention claimed is:

1. An apparatus for supporting a tape-frame substrate, the apparatus comprising:
    a chuck having a first side and a second side opposite the first side, the first side having a convex surface configured to support the tape-frame substrate;
    a plurality of channels extending through the chuck and having outlets along the first side, wherein the plurality of channels are configured to dispense fluid from the outlets along the convex surface of the first side; and
    a plurality of valves coupled to the chuck,
    wherein each valve corresponds to one channel of the plurality of channels,
    wherein each valve is configured to open when fluid is flowing through the channel and close when fluid is not flowing through the channel,
    wherein each valve is disposed at the outlet, and
    wherein in a closed position the valve is substantially flush with the convex surface.

2. The apparatus according to claim 1, wherein the convex surface is centered about a central axis extending through the chuck, the convex surface extending from a peak at a center of the chuck to an outer edge of the chuck, and wherein the convex surface has a height measured along the central axis between the peak to the outer edge, wherein the height is less than about 16 mm.

3. The apparatus according to claim 1, wherein a density of the outlets is 1 to 25 outlets per square centimeter.

4. The apparatus according to claim 1, wherein the outlets have a diameter of about 0.5 mm-3 mm.

5. The apparatus according to claim 1, wherein the outlets are configured to direct fluid at a plurality of different angles relative to a central axis extending through the chuck.

6. A system for supporting a tape-frame substrate, the system comprising:
    a chuck having a first side and a second side opposite the first side, the first side having a convex surface configured to support the tape-frame substrate;
    a plurality of channels extending through the chuck and having outlets along the first side, wherein the plurality of channels are configured to dispense fluid from the outlets along the convex surface of the first side;
    a plurality of valves coupled to the chuck; and
    a holder configured to mount a tape-frame substrate to the chuck,
    wherein the plurality of channels are configured to dispense fluid from the outlets and between the tape-frame substrate and the convex surface of the chuck when the tape-frame substrate is mounted to the chuck,
    wherein each valve corresponds to one channel of the plurality of channels,
    wherein each valve is configured to open when fluid is flowing through the channel and close when fluid is not flowing through the channel,
    wherein each valve is disposed at the outlet, and
    wherein in a closed position the valve is substantially flush with the convex surface.

7. The system according to claim 6, wherein the convex surface is centered about a central axis through the chuck, the convex surface extending from a peak at a center of the chuck to an outer edge of the chuck, wherein the convex surface has a height measured along the central axis from a peak to an outer edge of less than about 16 mm.

8. The system according to claim 7, wherein the holder is configured to permit limited relative movement along the central axis between the convex surface and the tape-frame substrate.

9. The system according to claim 7, wherein the chuck and the tape-frame substrate and the holder are configured to rotate together about the central axis.

10. The system according to claim 6, wherein a density of the outlets is 1 to 25 outlets per square centimeter.

11. The system according to claim 6, wherein the outlets have a diameter of about 0.5 mm-3 mm.

\* \* \* \* \*